United States Patent
Routamaa et al.

(10) Patent No.: US 9,985,630 B2
(45) Date of Patent: May 29, 2018

(54) METHOD AND A SWITCH DEVICE FOR PRODUCING AN ELECTRICAL SIGNAL IN RESPONSE TO MECHANICAL FORCE

(71) Applicant: WALLAC OY, Turku (FI)

(72) Inventors: Mika Olavi Routamaa, Lieto (FI); Timo Salminen, Turku (FI); Jussi Petteri Lehtonen, Turku (FI)

(73) Assignee: WALLAC OY, Turku (FI)

( * ) Notice: Subject to any disclaimer, the term of this patent is extended or adjusted under 35 U.S.C. 154(b) by 849 days.

(21) Appl. No.: 14/371,274

(22) PCT Filed: Jul. 18, 2013

(86) PCT No.: PCT/FI2013/050003
§ 371 (c)(1),
(2) Date: Jul. 9, 2014

(87) PCT Pub. No.: WO2013/104821
PCT Pub. Date: Jul. 18, 2013

(65) Prior Publication Data
US 2015/0097614 A1    Apr. 9, 2015

Related U.S. Application Data (60) Provisional application No. 61/585,758, filed on Jan. 12, 2012.

(30) Foreign Application Priority Data

Jan. 12, 2012   (FI) ...................................... 20125037

(51) Int. Cl.
*H01L 41/113* (2006.01)
*H03K 17/96* (2006.01)

(52) U.S. Cl.
CPC ..... *H03K 17/9622* (2013.01); *H03K 17/9625* (2013.01); *H03K 17/9643* (2013.01);
(Continued)

(58) Field of Classification Search
CPC ......... H01L 41/1132; G01L 23/10; G01L 1/16
(Continued)

(56) References Cited

U.S. PATENT DOCUMENTS

| | | | |
|---|---|---|---|
| 3,833,782 A | * | 9/1974 | Bartel .................... H01C 10/16 200/86.5 |
| 4,190,785 A | | 2/1980 | Kompanek |

(Continued)

FOREIGN PATENT DOCUMENTS

| | | | | |
|---|---|---|---|---|
| CN | 101640528 | | 2/2010 | |
| DE | 2433208 A | * | 8/1975 | ............. H03K 17/94 |

(Continued)

OTHER PUBLICATIONS

International Search Report, dated Jun. 3, 2013, from corresponding PCT application.

(Continued)

*Primary Examiner* — Thomas Dougherty
(74) *Attorney, Agent, or Firm* — Young & Thompson (57) ABSTRACT

A switch device for producing one or more electrical signals in response to mechanical force includes a body-part (101) and one or more electric transducers (102-105) connected to the body-part and arranged to produce the one or more electrical signals in response to mechanical force directed to the body-part. The body-part includes a cavity (106), and a wall constituting the bottom of the cavity is capable of being bent by mechanical force directed to the wall from the opposite side with respect to the cavity. The one or more electric transducers are located in the cavity and arranged to produce the one or more electrical signals when the bottom (Continued)

of the cavity is bent. The switch device can be built, for example, into a working plane of an electrical instrument so that a plate constituting the working plane constitutes also the body-part of the switch device.

18 Claims, 4 Drawing Sheets

(52) U.S. Cl.
CPC .............. *H03K 2217/96015* (2013.01); *H03K 2217/960745* (2013.01); *H03K 2217/960755* (2013.01)

(58) Field of Classification Search
USPC ................................ 310/324, 328, 338, 319
See application file for complete search history.

(56) References Cited

U.S. PATENT DOCUMENTS

| | | | | |
|---|---|---|---|---|
| 4,521,712 | A * | 6/1985 | Braun | H01L 41/1132 310/339 |
| 4,562,315 | A | 12/1985 | Aufderheide | |
| 4,644,315 | A * | 2/1987 | Hodges | H03K 17/97 338/12 |
| 5,231,326 | A * | 7/1993 | Echols | B66B 1/462 310/319 |
| 6,064,141 | A * | 5/2000 | Wiciel | H03K 17/964 310/324 |
| 7,067,751 | B2 * | 6/2006 | Nishimura | H01H 21/04 200/293 |
| 7,358,654 | B2 * | 4/2008 | Aromin | H03K 17/964 310/328 |
| 7,652,230 | B2 | 1/2010 | Baier | |
| 8,742,647 | B2 * | 6/2014 | Fluhrer | H03K 17/964 310/338 |
| 9,269,885 | B2 * | 2/2016 | Jiang | H01L 41/0973 |
| 9,391,608 | B2 * | 7/2016 | Wende | H03K 17/962 |
| 2003/0169231 | A1 * | 9/2003 | Rekimoto | G06F 3/0362 345/156 |
| 2005/0133351 | A1 * | 6/2005 | Hein | H01H 13/83 200/310 |
| 2007/0151357 | A1 * | 7/2007 | Kurtz | G01L 1/2231 73/777 |
| 2009/0312051 | A1 | 12/2009 | Hansson et al. | |
| 2010/0007531 | A1 | 1/2010 | Fluhrer | |
| 2012/0074514 | A1 * | 3/2012 | Nguyen | H01J 37/32935 257/467 |
| 2015/0378514 | A1 * | 12/2015 | Keski-Jaskari | H03K 17/964 345/178 |
| 2016/0203710 | A1 * | 7/2016 | Bataillou | G08C 19/28 340/12.55 |

FOREIGN PATENT DOCUMENTS

| | | | | |
|---|---|---|---|---|
| EP | 0164662 | A1 | 12/1985 | |
| EP | 0525374 | | * 2/1993 | .......... H03K 17/964 |
| EP | 0525374 | A1 | 2/1993 | |
| EP | 1983803 | A1 | 10/2008 | |
| JP | 02116299 | A | * 4/1990 | ............. H04R 17/00 |
| WO | 2005073634 | A1 | 8/2005 | |
| WO | WO02017/077168 | A1 * | 5/2017 | ............... G01L 9/12 |

OTHER PUBLICATIONS

Chinese Office Action in corresponding Chinese Application No. 201380005070.x, dated Apr. 15, 2016.

* cited by examiner

METHOD AND A SWITCH DEVICE FOR PRODUCING AN ELECTRICAL SIGNAL IN RESPONSE TO MECHANICAL FORCE

FIELD OF THE INVENTION

The invention relates to a method for producing one or more electrical signals in response to mechanical force. Furthermore, the invention relates to a switch device for producing one or more electrical signals in response to mechanical force directed to the switch device. Furthermore, the invention relates to an electrical instrument comprising one or more switch devices for controlling the electrical instrument.

BACKGROUND

Many electrical instruments such as, for example, optical measurement instruments and electrical instruments for cutting off sample regions from a sample carrier comprise one or more switch devices for controlling operation. A device for cutting off sample regions from a sample carrier is commonly used in a practice where one or more drops of fluid to be examined are impregnated onto a sample carrier, the sample carrier impregnated with the fluid is dried, and then the sample carrier is sent to a laboratory for analysis. The fluid to be examined can be, for example, blood of a newborn baby and the sample carrier can be, for example, a sheet of filter paper or some other suitable porous material which is able to absorb the fluid to be examined. In the laboratory, one or more sample regions containing the fluid to be examined are cut off from the sample carrier and the detached sample regions are conveyed, for further analysis, to sample wells of e.g. a microtitration plate or some other sample well element. Each sample region can be cut off from the sample carrier for example with a punch arranged to cut off the sample region with a single stroke through the sample carrier. In this case, the electrical instrument for cutting off sample regions from a sample carrier is typically called a puncher. It is also possible that the electrical instrument comprises cutting means, e.g. a laser or a water jet cutter, capable of producing a localized, point-form cut on the sample carrier and means for moving the point-form cutting impact produced by the cutting means along the outer periphery of each sample region so as to detach the sample region from the sample carrier.

An optical measurement instrument is applicable in cases where an analysis of a sample can be based on optical radiation emitted by the sample and/or on optical properties, e.g. an optical filtering effect, of the sample. One exemplifying analysis method is based on photoluminescence measurement where emission of a substance is measured from a sample with simultaneous excitation by illumination. Another exemplifying analysis method is based on chemiluminescence measurement where emission of a substance is measured from a sample without simultaneous excitation by illumination. An optical measurement instrument comprises typically an excitation light source for producing an excitation beam to a sample to be measured and a detector for detecting a beam from a sample being measured and for producing a detection signal responsive to the detected beam.

In the activity of the kind described above, cleanliness is very important. Thus, especially parts of a user interface of an electrical instrument which are touched during normal operation should be easy to keep clean. For example, switch devices for controlling an electrical instrument may comprise parts, for example push buttons, which are movable relative to their surroundings and thus there can be slits between these parts and their surrounding structures. In some cases, it may be laborious to keep such parts clean because dust and other impurities tend to gather into the slits. In a known technical solution, a user interface comprises a flexible sheet which covers the parts of the user interface which are touched during normal operation. The flexible sheet provides a uniform surface which does not have any slits and thus is easy to keep clean. The flexible sheet, however, increases the number of components and thus decreases the cost efficiency. Furthermore, the edges of the flexible sheet need to be joined to other structures of an electrical instrument so that the edges do not, in turn, form structures which may be difficult to keep clean.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new electrical instrument comprising a plate constituting a working plane of the electrical instrument and a switch device for controlling operation of the electrical instrument, the switch device comprising:
  a body-part, and
  one or more electric transducers connected to the body-part and arranged to produce one or more electrical signals in response to mechanical force directed to the body-part,
wherein the body-part comprises a cavity, and a wall constituting a bottom of the cavity is capable of being bent by the mechanical force directed to the wall from the opposite side with respect to the cavity, and the one or more electric transducers are located in the cavity and arranged to produce the one or more electrical signals when the bottom of the cavity is bent.

The plate constituting the working plane of the electrical instrument constitutes also the body-part of the switch device. Thus, the switch device can be integrated with the working plane so that the surface of the working plane can be uniform and free of slits or other structures into which dust and other impurities would tend to gather.

The one or more electric transducers can be, for example, piezoelectric transducers responsive to the bending of the bottom of the cavity, capacitive transducers whose capacitance changes when the bottom of the cavity is bent, or strain gauges whose impedance changes when the bottom of the cavity is bent.

The electrical instrument can be, for example, an electrical instrument for optical measurements or an electrical instrument for cutting off sample regions from a sample carrier.

In accordance with the invention, there is provided also a new method for producing one or more electrical signals for controlling an electrical instrument comprising a plate constituting a working plane of the electrical instrument, the method comprising:

directing mechanical force to a wall constituting a bottom of a cavity of a body part, the mechanical force being directed to the wall from the opposite side with respect to the cavity, and producing the one or more electrical signals with one or more electric transducers located in the cavity and arranged to produce the one or more electrical signals when the bottom of the cavity is bent, wherein the plate constituting the working plane of the electrical instrument constitutes also the body-part comprising the cavity.

A number of exemplifying embodiments of the invention are described in accompanied dependent claims.

Various exemplifying embodiments of the invention both as to constructions and to methods of operation, together with additional objects and certain advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

The exemplifying embodiments of the invention and certain advantages are explained in greater detail below in the sense of examples and with reference to the accompanying drawings, in which:

FIG. 1b shows a view seen along the arrow B presented in FIG. 1a, FIG. 2a shows a schematic side section view of an electrical instrument according to an exemplifying embodiment of the invention for cutting off one or more sample regions from a sample carrier.

DESCRIPTION OF THE EXEMPLIFYING EMBODIMENTS

Figure 1A:
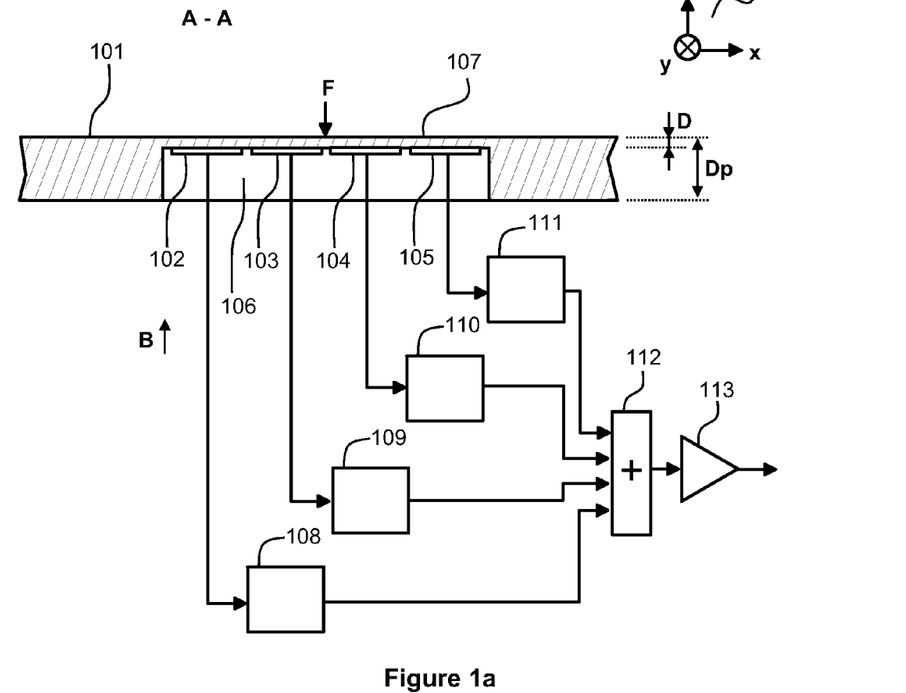
FIG. 1a shows a schematic side section view of a switch device according to an exemplifying embodiment of the invention.
Figure 1B:
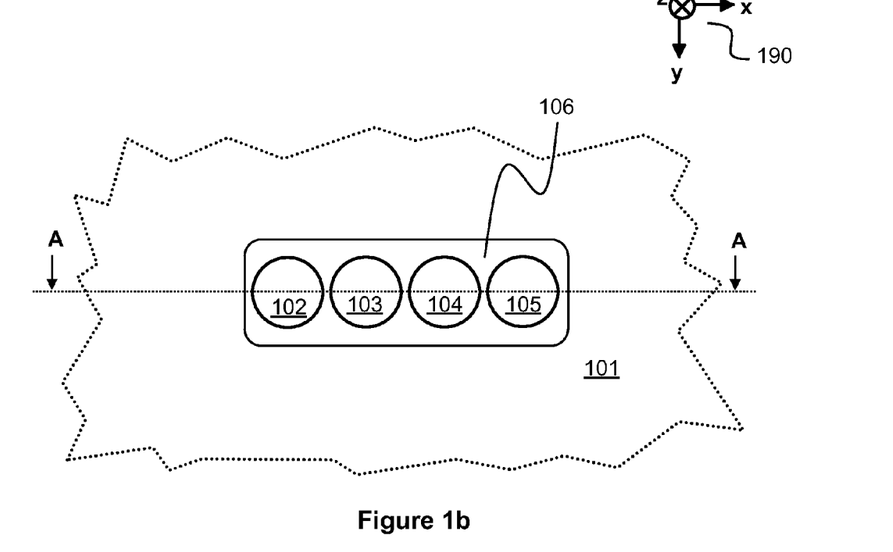

FIG. 1a shows a schematic side section view of a switch device according to an exemplifying embodiment of the invention. FIG. 1b shows a view seen along the arrow B presented in FIG. 1a. The section shown in FIG. 1a is taken along the line A-A shown in FIG. 1b. The switch device comprises a body-part 101 that has a cavity 106. A wall 107 constituting the bottom of the cavity is capable of being bent by mechanical force F directed to the wall from the opposite side with respect to the cavity. The switch device comprises electric transducers 102, 103, 104, and 105 located in the cavity 106 and arranged to produce electrical signals when the bottom of the cavity is bent due to the mechanical force F. As can be seen from FIG. 1a, the surface from which the switch device is operated by directing the mechanical force F to the switch device can be uniform and free of slits and other structures into which dust and other impurities would tend to gather.

In a switch device according to an exemplifying embodiment of the invention, the body-part is made of a single piece of material. The piece of material can be, for example, a plate provided with the cavity 106 so that the thickness D of the wall 107 constituting the bottom of the cavity is smaller than the thickness Dp of the plate in the surroundings of the cavity. The ratio Dp/D can be, for example, at least 5 or if desired at least 10. The plate can be, for example, made of metal that can be, for example, aluminum. It is also possible that the body-part comprises layers which are stacked in the z-direction of the co-ordinate system 190.

In a switch device according to an exemplifying embodiment of the invention, the electric transducers 102-105 are piezoelectric transducers responsive to bending of the bottom of the cavity. The piezoelectric transducers can be attached to the bottom of the cavity using a fastener that can be, for example, glue.

In a switch device according to an exemplifying embodiment of the invention, the electric transducers 102-105 are capacitive transducers whose capacitance is arranged to change when the bottom of the cavity is bent.

In a switch device according to an exemplifying embodiment of the invention, the electric transducers 102-105 are strain gauges which are attached to the bottom of the cavity and whose impedance is arranged to change when the bottom of the cavity is bent.

The thickness D of the wall 107 that constitutes the bottom of the cavity 106 is selected so that a sufficient bending is achieved with appropriate mechanical force F. The suitable thickness depends on the width and length of the cavity, on the material of the body-part, and on the properties of the one or more electrical transducers located in the cavity. In a switch device according to an exemplifying embodiment of the invention, the thickness D of the wall 107 is less than 10% of the radius of the greatest circle capable of being covered by the bottom of the cavity. For example, when the electric transducers 102-105 are piezoelectric transducers, the body-part is made of aluminum, and the width and length of the cavity are 30 mm and 120 mm, the thickness D of the wall 107 is suitably about 1 mm.

A switch device according to an exemplifying embodiment of the invention comprises low-pass filters 108, 109, 110 and 111 arranged to filter the electrical signals produced by the electric transducers 102-105. The low-pass filters 108-109 are used for attenuating possible high-frequency disturbances from the electrical signals produced by the electric transducers.

A switch device according to an exemplifying embodiment of the invention comprises band-pass filters arranged to filter the electrical signals produced by the electric transducers. With appropriate selection of the frequency response of the band-pass filters, it is possible to determine the temporal profile of the mechanical force F operating the switch device. For example, with a suitable selection of the frequency response, the switch device can be tuned so that it reacts only when it is tapped but not when it is e.g. smoothly pressed.

A switch device according to an exemplifying embodiment of the invention comprises an adder 112 for summing the electrical signals produced by the electric transducers 102-105 into a single electrical signal. The switch device may further comprise an amplifier 113 arranged to amplify the electrical signal produced with the adder.

It should be noted that the signal processing operation accomplished with the filters 108-111, the adder 112, and the amplifier 113 can be implemented in many different ways. For example, the adder can be connected directly to the electric transducers 102-105 and the single electrical signal produced by the adder can be filtered and/or amplified.

Figure 2A:
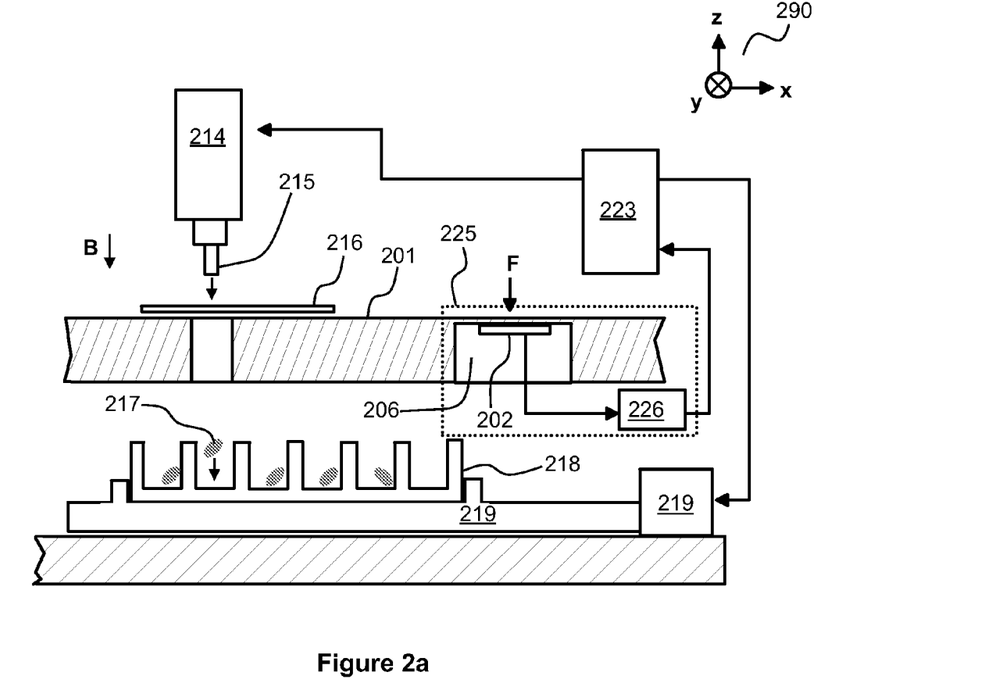
Figure 2B:
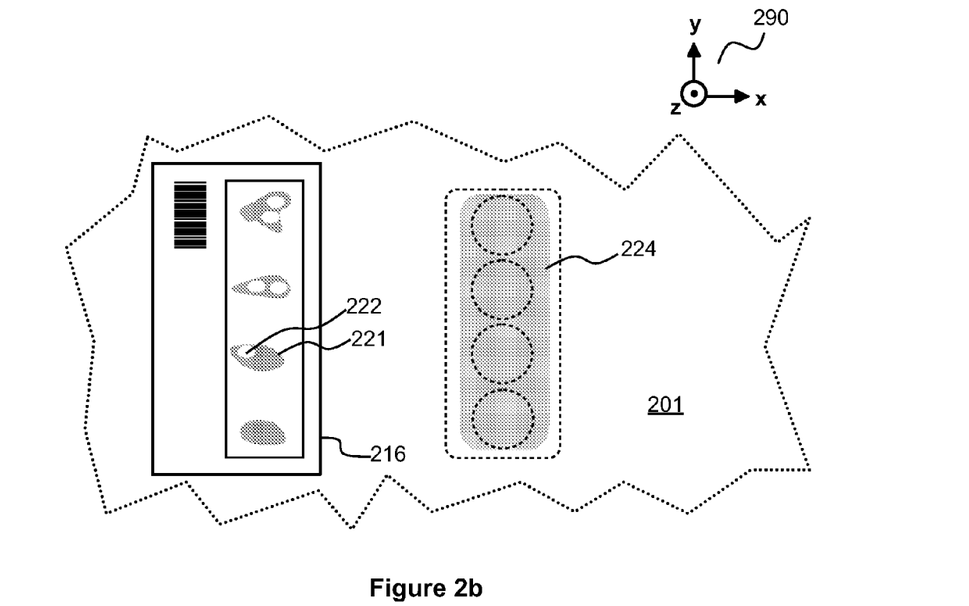
FIG. 2b shows a view seen along the arrow B presented in FIG. 2a, FIG. 3 shows a schematic side section view of an optical measurement instrument according to an exemplifying embodiment of the invention.

FIG. 2a shows a schematic side section view of an electrical instrument according to an exemplifying embodiment of the invention for cutting off one or more sample regions from a sample carrier 216 that contains impregnated sample material. FIG. 2b shows a view seen along the arrow B presented in FIG. 2a. The sample carrier 216 may comprise, for example, a sheet of filter paper or some other suitable porous material which is able to absorb the sample material that can be e.g. blood of a newborn baby. A blotch 221 on the sample carrier 216, see FIG. 2b, is one of the regions of the sample carrier into which the sample material has been impregnated. Sample regions are cut off from the regions of the sample carrier into which the sample material has been impregnated. After cutting, the detached sample regions are conveyed for further analysis to sample wells of a sample well element 218 that can be e.g. a microtitration plate. For example, a detached sample region 217 shown in FIG. 2a has been cut off from the region 221 shown in FIG. 2b. The region 221 has a hole 222 on the place from which the sample region 217 has been cut off. The detached sample region 217 that has been received at the sample well may be later subjected to e.g. biochemical analysis. The sample carrier 216 may comprise a machine-readable bar code that may contain, for example, information about the donor of the sample material, information about the time and place of taking the sample, and/or other appropriate information.

The electrical instrument for cutting off the one or more sample regions from the sample carrier comprises a cutting element 214 for cutting off the sample regions from desired locations of the sample carrier. In the exemplifying case shown in FIG. 2a, the cutting element comprises a punch 215 that is arranged to detach each sample region from the sample carrier 216 with a stroke through the sample carrier. Mechanical support structures which support the cutting element 214 are not shown in FIG. 2a, but the mechanical support structures including possible servomotors and/or position sensors can be such as known from the prior art. In an electrical instrument according to another embodiment of the invention, the cutting element comprises a cutting instrument for producing a localized, point-form cut on the sample carrier and equipment for directing the cutting instrument so that the cutting impact produced by the cutting instrument is moved along the outer periphery of each sample region so as to cut off the sample region from the sample carrier. The above-mentioned cutting instrument can be, for example, a laser beam cutter or a liquid, e.g. water, jet cutter.

The electrical instrument comprises mechanical support structures 219 for supporting the sample well element 218 so that an appropriate sample well of the sample well element is able to receive each sample region cut off from the sample carrier. The mechanical support structures are capable of moving the sample well element 219 in the xy-plane of a coordinate system 290. The mechanical support structures may include servomotors and/or position sensors such as known from the prior art.

The electrical instrument comprises a support element 201 for supporting the sample carrier 216 and a processor 223 for controlling the cutting element 214 and the mechanical support structures 219.

The electrical instrument comprises a switch device 225 for activating the cutting element 214 to cut a sample region off from the sample carrier 216. The switch device is arranged to produce an electrical signal that controls the processor 223. The switch device comprises a body-part having a cavity 206 and one or more electric transducers 202 located in the cavity and arranged to produce the electrical signal when the bottom of the cavity is bent due to mechanical force F. The area to which the mechanical force F is to be directed is shown as a gray area 224 in FIG. 2b. In FIG. 2b, the outlines of the cavity and the electric transducers that are on the opposite side of the support element 201 are shown with dashed lines.

The switch device may further comprise signal processing means 226 which may include one or more filters, adders, amplifiers, and/or comparators for converting the one or more electrical signals produced by the one or more electric transducers 202 into a form suitable for the processor 223. In the exemplifying case illustrated in FIGS. 2a and 2, the support element 201 constitutes also the body-part of the switch device 225. The support element 201 can be, for example, a plate of metal e.g. aluminum.

Figure 3:
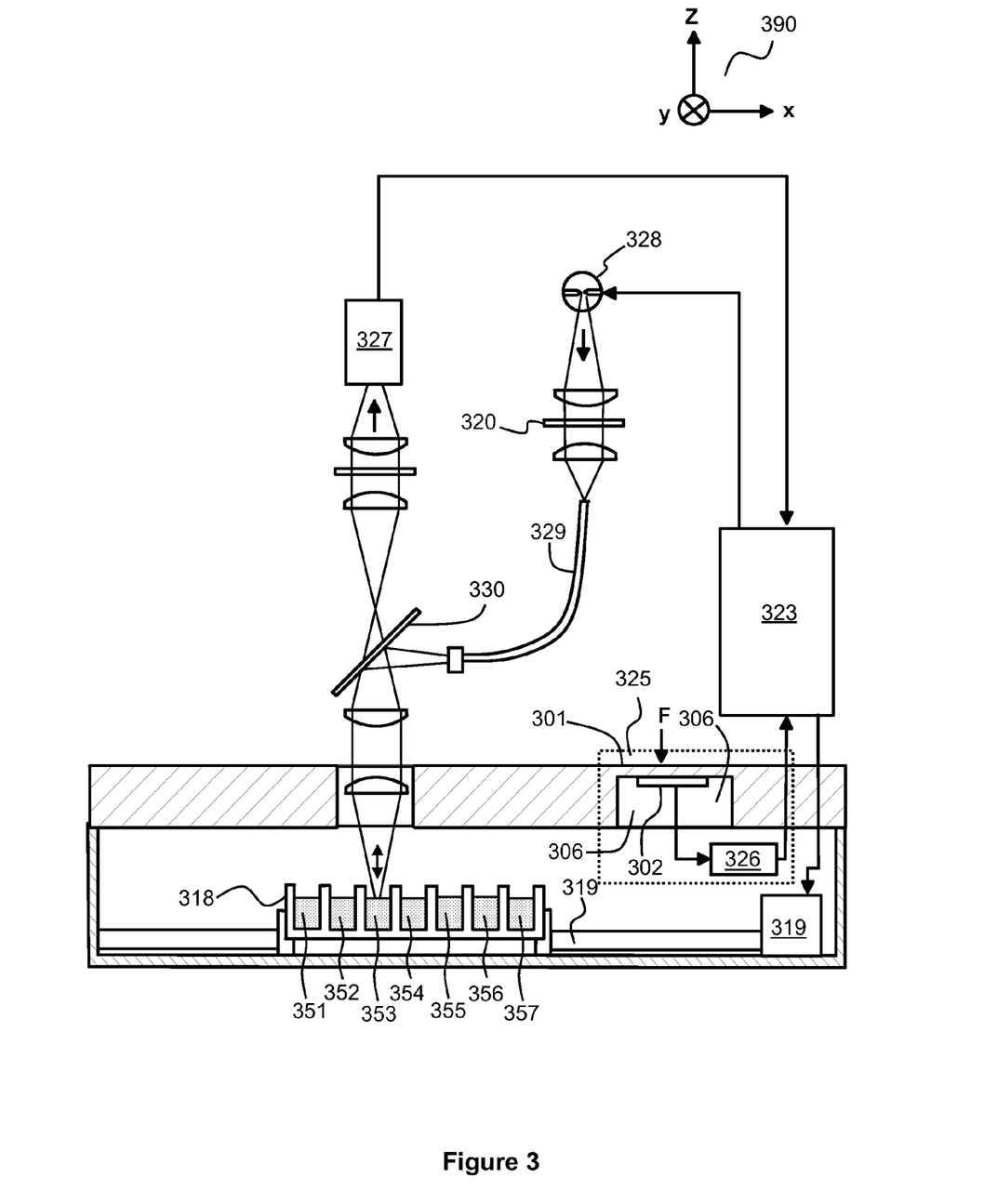

FIG. 3 shows a schematic side section view of an electrical instrument according to an exemplifying embodiment of the invention for optical measurements of samples. The samples 351, 352, 353, 354, 355, 356, 357 to be measured are stored in sample wells of a sample well element 318. The electrical instrument comprises mechanical support structures 319 for supporting the sample well element 318 so that the sample well element 319 can be moved in the xy-plane of a coordinate system 390.

The electrical instrument comprises an excitation light source 328 arranged to produce an excitation light beam. The excitation light source 328 can be, for example, a flash lamp. The excitation light beam radiated by the excitation light source is collimated with a collimating lens and directed through an optical filter 320. The excitation light beam is then focused with a focusing lens to an end of a fibre optic guide 329, which guides the excitation light beam to a dichroic mirror 330. The fibre optic guide can be, for example, a bundle of fibres, such as e.g. 200 pieces of fibres with a diameter of e.g. 100 µm. The bundle of fibres can be used for mixing the excitation light beam in order to avoid an uneven distribution of light on a sample to be measured. The excitation light beam is reflected by the dichroic mirror 330 to a collimating lens. The excitation light beam is then focused with a focusing lens to the sample 353.

The electrical instrument comprises a processor 323 for controlling the excitation light source 328 and the mechanical support structures 319. The electrical instrument comprises a switch device 325 for activating the electrical instrument to start the optical measurements. The switch device is arranged to produce an electrical signal that controls the processor 323. The switch device comprises a body-part 301 having a cavity 306 and one or more electric transducers 302 located in the cavity and arranged to produce the electrical signal when the bottom of the cavity is bent due to mechanical force F. The switch device may further comprise signal processing means 326 which may include one or more filters, adders, amplifiers, and/or comparators for converting the one or more electrical signal produced by the one or more electric transducers 302 into a form suitable for the processor 323. In the exemplifying case illustrated in FIG. 3, the body-part 301 of the switch device constitutes also a part of the frame structure of the electrical instrument.

Figure 4:
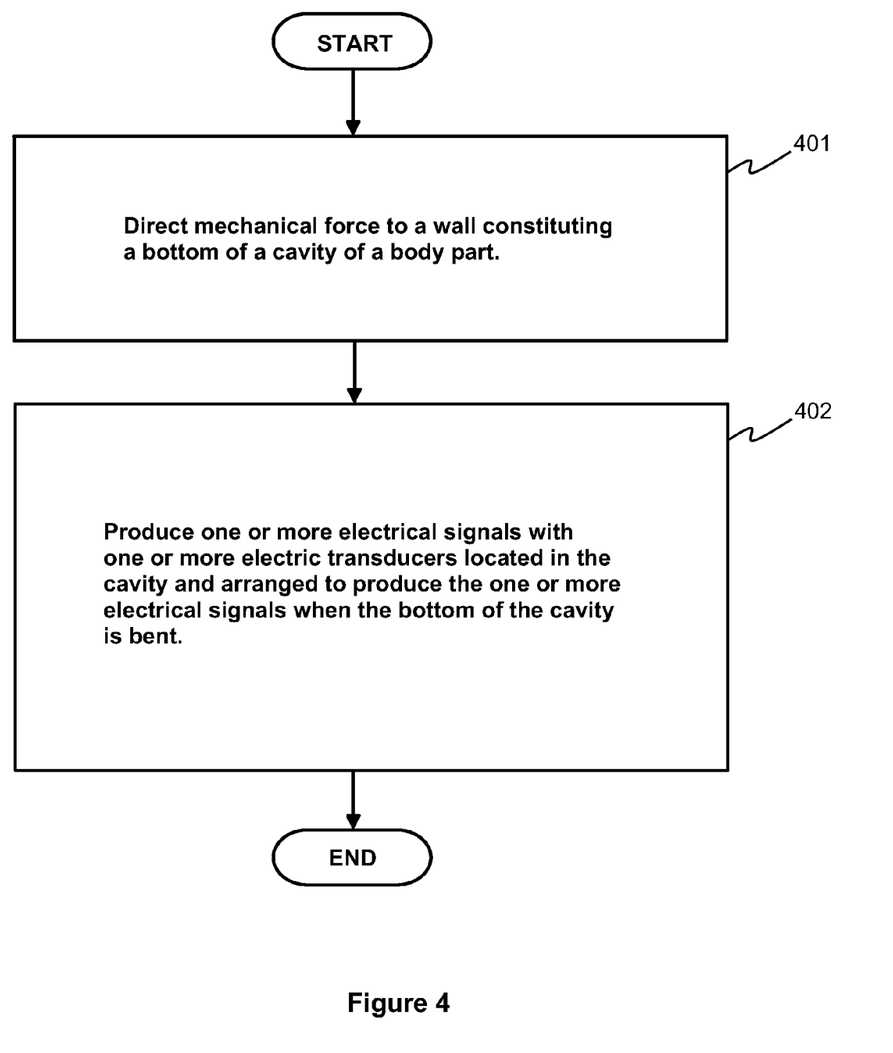
FIG. 4 shows a flow-chart of a method according to an exemplifying embodiment of the invention for producing one or more electrical signals in response to mechanical force.

FIG. 4 shows a flow-chart of a method according to an exemplifying embodiment of the invention for producing one or more electrical signals in response to mechanical force. The method comprises:
in the phase 401: directing the mechanical force to a wall constituting a bottom of a cavity of a body-part, the mechanical force being directed to the wall from the opposite side with respect to the cavity, and
in the phase 402: producing the one or more electrical signals with one or more electric transducers located in the cavity and arranged to produce the one or more electrical signals when the bottom of the cavity is bent due to the mechanical force.

A method according to an exemplifying embodiment of the invention comprises low-pass filtering the one or more electrical signals.

A method according to an exemplifying embodiment of the invention comprises band-pass filtering the one or more electrical signals.

A method according to an exemplifying embodiment of the invention comprises summing the electrical signals produced by the electric transducers into a single electrical signal.

In a method according to an exemplifying embodiment of the invention, the one or more electric transducers are piezoelectric transducers responsive to the bending of the bottom of the cavity.

In a method according to an exemplifying embodiment of the invention, the one or more electric transducers are capacitive transducers whose capacitance changes when the bottom of the cavity is bent.

In a method according to an exemplifying embodiment of the invention, the one or more electric transducers are strain gauges whose impedance changes when the bottom of the cavity is bent.

The specific examples provided in the description given above should not be construed as limiting the applicability and/or the interpretation of the appended claims.

What is claimed is:

1. An electrical instrument comprising:
a support element, the support element being a plate having a first surface constituting a working plane for a user of the electrical instrument and a second surface opposite the first surface,
the plate further comprising a cavity constituted by sides extending from the second surface towards the first surface and a wall constituting a bottom of the cavity, a first surface of the wall being part of the first surface of the plate and constituting part of the working plane, and an opposite, second surface of the wall forming a bottom surface of the cavity,
wherein mechanical force (F) directed to the wall from the first surface of the plate, constituting the part of the working plane, bends the wall towards the second surface of the plate;
a switch device for controlling operation of the electrical instrument, the switch device comprising one or more electric transducers located on the bottom surface of the cavity and arranged to produce one or more electrical signals in response to the mechanical force (F) directed to the wall from the first surface of the plate, constituting the part of the working plane, bending the wall towards the second surface of the plate; and
an adder for summing the electrical signals produced by the electric transducers into a single electrical signal.

2. The electrical instrument according to claim 1, wherein the plate is made of a single piece of material.

3. The electrical instrument according to claim 2, wherein the plate is a plate of metal provided with the cavity, a thickness of the wall constituting the bottom of the cavity being smaller than a thickness of the plate in surroundings of the cavity at the sides extending from the second surface towards the first surface.

4. The electrical instrument according to claim 1, wherein a thickness of the wall is less than 10% of a radius of a greatest circle capable of being covered by the bottom of the cavity.

5. The electrical instrument according to claim 1, further comprising one or more low-pass filters arranged to filter the one or more electrical signals.

6. The electrical instrument according to claim 1, further comprising one or more band-pass filters arranged to filter the one or more electrical signals.

7. The electrical instrument according to claim 1, further comprising an amplifier arranged to amplify the electrical signal produced with the adder.

8. The electrical instrument according to claim 1, wherein the one or more electric transducers are piezoelectric transducers responsive to bending of the bottom of the cavity.

9. The electrical instrument according to claim 1, wherein the one or more electric transducers are capacitive transducers whose capacitance is arranged to change when the bottom of the cavity is bent.

10. The electrical instrument according to claim 1, wherein the one or more electric transducers are strain gauges whose impedance is arranged to change when the bottom of the cavity is bent.

11. The electrical instrument according to claim 1, wherein the electrical instrument is suitable for cutting off one or more sample regions from a sample carrier that contains impregnated sample material and wherein,
the working plane is suitable for supporting the sample carrier,
the electrical instrument further comprises a cutting element for cutting off the one or more sample regions from the sample carrier, and
the switch device is suitable for activating the cutting element to cut the sample region off from the sample carrier.

12. The electrical instrument according to claim 1, wherein the electrical instrument is suitable for optical measurements and wherein,
the electrical instrument further comprises an excitation light source arranged to produce an excitation beam to at least one of samples to be measured,
the electrical instrument further comprises a detector arranged to detect a beam from one of the samples to be measured and to produce a detection signal responsive to the detected beam, and
the switch device is suitable for activating the electrical instrument to start the optical measurements.

13. A method for producing one or more electrical signals for controlling an electrical instrument comprising i) a support element, the support element being a plate having a first surface constituting a working plane for a user of the electrical instrument and a second surface opposite the first surface, the plate further comprising a cavity constituted by sides extending from the second surface towards the first surface and a wall constituting a bottom of the cavity, a first surface of the wall being part of the first surface of the plate and constituting part of the working plane, and an opposite, second surface of the wall forming a bottom surface of the cavity, wherein mechanical force (F) directed to the wall from the first surface of the plate, constituting the part of the working plane, bends the wall towards the second surface of the plate, and ii) a switch device for controlling operation of the electrical instrument, the switch device comprising one or more electric transducers located on the bottom surface of the cavity and arranged to produce one or more electrical signals in response to the mechanical force (F) directed to the wall bending the wall towards the second surface of the plate, the method comprising:
- directing the mechanical force to the wall constituting the bottom of a cavity, the mechanical force being directed to the wall by directing the force (F) to the first surface of the plate constituting the part of the working plane, to thereby bend the wall towards the second surface of the plate;
- in response to the wall bending towards the second surface of the plate, producing the one or more electrical signals with the one or more electric transducers located on the bottom surface of the cavity; and
- summing the electrical signals into a single electrical signal.

14. The method according to claim 13, further comprising the step of low-pass filtering the one or more electrical signals.

15. The method according to claim 13, further comprising the step of band-pass filtering the one or more electrical signals.

16. The method according to claim 13, wherein the one or more electric transducers are piezoelectric transducers responsive to the bending of the bottom of the cavity.

17. The method according to claim 13, wherein the one or more electric transducers are capacitive transducers whose capacitance changes when the bottom of the cavity is bent.

18. The method according to claim 13, wherein the one or more electric transducers are strain gauges whose impedance changes when the bottom of the cavity is bent.

* * * * *

UNITED STATES PATENT AND TRADEMARK OFFICE
CERTIFICATE OF CORRECTION

PATENT NO. : 9,985,630 B2  
APPLICATION NO. : 14/371274  
DATED : May 29, 2018  
INVENTOR(S) : Mika Olavi Routamaa et al.

Page 1 of 1

It is certified that error appears in the above-identified patent and that said Letters Patent is hereby corrected as shown below:

On the Title Page

Item "(22) PCT Filed: Jul. 18, 2013"  
Should be replaced with:  
--(22) PCT Filed: Jan. 3, 2013--.

Signed and Sealed this  
Second Day of October, 2018

Andrei Iancu  
*Director of the United States Patent and Trademark Office*